United States Patent [19]

Ong et al.

[11] Patent Number: 5,465,232
[45] Date of Patent: Nov. 7, 1995

[54] SENSE CIRCUIT FOR TRACKING CHARGE TRANSFER THROUGH ACCESS TRANSISTORS IN A DYNAMIC RANDOM ACCESS MEMORY

[75] Inventors: Adrian E. Ong; Paul S. Zagar, both of Boise, Id.

[73] Assignee: Micron Semiconductor, Inc., Boise, Id.

[21] Appl. No.: 275,890

[22] Filed: Jul. 15, 1994

[51] Int. Cl.[6] .................................................. G11C 11/40
[52] U.S. Cl. ............................. 365/189.05; 365/189.11; 365/205; 365/210
[58] Field of Search ..................................... 365/205, 207, 365/210, 189.05, 189.11, 191, 193

[56] References Cited

U.S. PATENT DOCUMENTS 4,298,960  11/1981  Mitake et al. ........................... 365/210

Primary Examiner—Joseph A. Popek
Attorney, Agent, or Firm— Angus C. Fox, III

[57] ABSTRACT

A simple, low-power sense circuit is disclosed that accurately tracks charge transfer between the capacitor of a dynamic random access memory cell and its associated digit line. The circuit, which is preferably located in the peripheral circuitry, employs a model access transistor to charge a pull-up node that is coupled to ground through a capacitor which simulates digit line capacitance. The pull-up node is coupled to the gate of a N-channel field-effect output transistor. When voltage on the node reaches the threshold voltage of the output transistor, the output transistor begins to turn on. The output from the output transistor (in this case, ground potential) is fed back to the gate of a P-channel device which couples the node to $V_{CC}$. The P-channel device is used to pull up the node to $V_{CC}$ rapidly once the trip point (i.e., the threshold voltage) of the N-channel output transistor is reached. The sense circuit is reset for the next read cycle by sending a high signal to the gate of an N-channel reset transistor, which couples the capacitive node to ground.

13 Claims, 1 Drawing Sheet

ས5,465,232

SENSE CIRCUIT FOR TRACKING CHARGE TRANSFER THROUGH ACCESS TRANSISTORS IN A DYNAMIC RANDOM ACCESS MEMORY

FIELD OF THE INVENTION

This invention relates to a sense circuit for tracking charge transfer timing through a memory cell access transistor during read operations in a dynamic random access memory so that optimum latching of charge on the bitline may be implemented.

BACKGROUND OF THE INVENTION

Dynamic random access memories comprise a multiplicity of row and column addressable memory cells. Each memory cell comprises a capacitor and an insulated-gate field-effect (IGFET) access transistor. The capacitor is coupled to a column line (also referred to as either a digit line or a bit line) through the access transistor, the gate of which is controlled by a row line (also referred to as a word line). A binary bit of data is represented by either a charged cell capacitor (a binary 1) or an uncharged cell capacitor (a binary 0). In order to determine the contents of a particular memory cell, the word line associated with that memory cell is activated, thus shorting the cell capacitor to the digit line associated with that particular cell. It has become common to "bootstrap" the word line to a voltage greater than the power supply voltage ($V_{CC}$) so that the full charge (or lack of charge) in the cell is dumped to the digit line. Prior to the read operation, the digit lines are equilibrated to $V_{CC}/2$. Thus, when a cell capacitor is shorted to its respective digit line, the equilibration voltage is either bumped up slightly by a charged capacitor or pulled down slightly by a discharged capacitor. Once full charge transfer has occurred between the digit line and the cell capacitor, sense amplifiers associated with the digit line are activated in order to latch the date. The latching operation may be described as follows: If the resulting digit line voltage is less than $V_{CC}/2$, an N-channel sense amplifier pulls the digit line to ground potential; conversely, if the resulting digit line voltage is greater than $V_{CC}/2$, a P-channel sense amplifier line raises the voltage on the digit line to a full $V_{CC}$.

Timing of the latching operation is critical. If latching takes place before full charge transfer has occurred, the latched values may not reflect the true data value of stored data bit. On the other hand, if latching takes place too long after full charge transfer has occurred, the charge on the digit line will partially dissipate and the latched value may not reflect the true value of the stored data bit. Even if the data is not inaccurately latched, the operational speed of the memory will suffer. On thing is clear. Clearly, there is an optimum moment for the latching of data in a dynamic random access memory. The more closely the latching operations coincide with that optimum moment, the more sound the operational characteristics of the memory.

Present-day technology typically employs a series of delay elements or a Schmidt trigger in combination with dummy memory array elements (which provide an approximation of the RC time constant of the actual memory array) to approximate the optimum moment for latching. In this disclosure, a compact sense circuit is disclosed which more accurately tracks charge transfer between the capacitor of a dynamic random access memory cell and its associated digit line.

SUMMARY OF THE INVENTION

A simple, low-power sense circuit is disclosed that accurately tracks charge transfer between the capacitor of a dynamic random access memory cell and its associated digit line. The circuit, which is preferably located in the peripheral circuitry, employs a model access transistor to charge a pull-up node that is coupled to ground through a capacitor which simulates digit line capacitance. The pull-up node is coupled to the gate of a N-channel field-effect output transistor. When voltage on the node reaches the threshold voltage of the output transistor, the output transistor begins to turn on. The output from the output transistor (in this case, ground potential) is fed back to the gate of a P-channel device which couples the node to $V_{CC}$. The P-channel device is used to pull up the node to $V_{CC}$ rapidly once the trip point (i.e., the threshold voltage) of the N-channel output transistor is reached. The sense circuit is reset for the next read cycle by sending a high signal to the gate of an N-channel reset transistor, which couples the capacitive node to ground.

PREFERRED EMBODIMENT OF THE INVENTION

Figure 1:
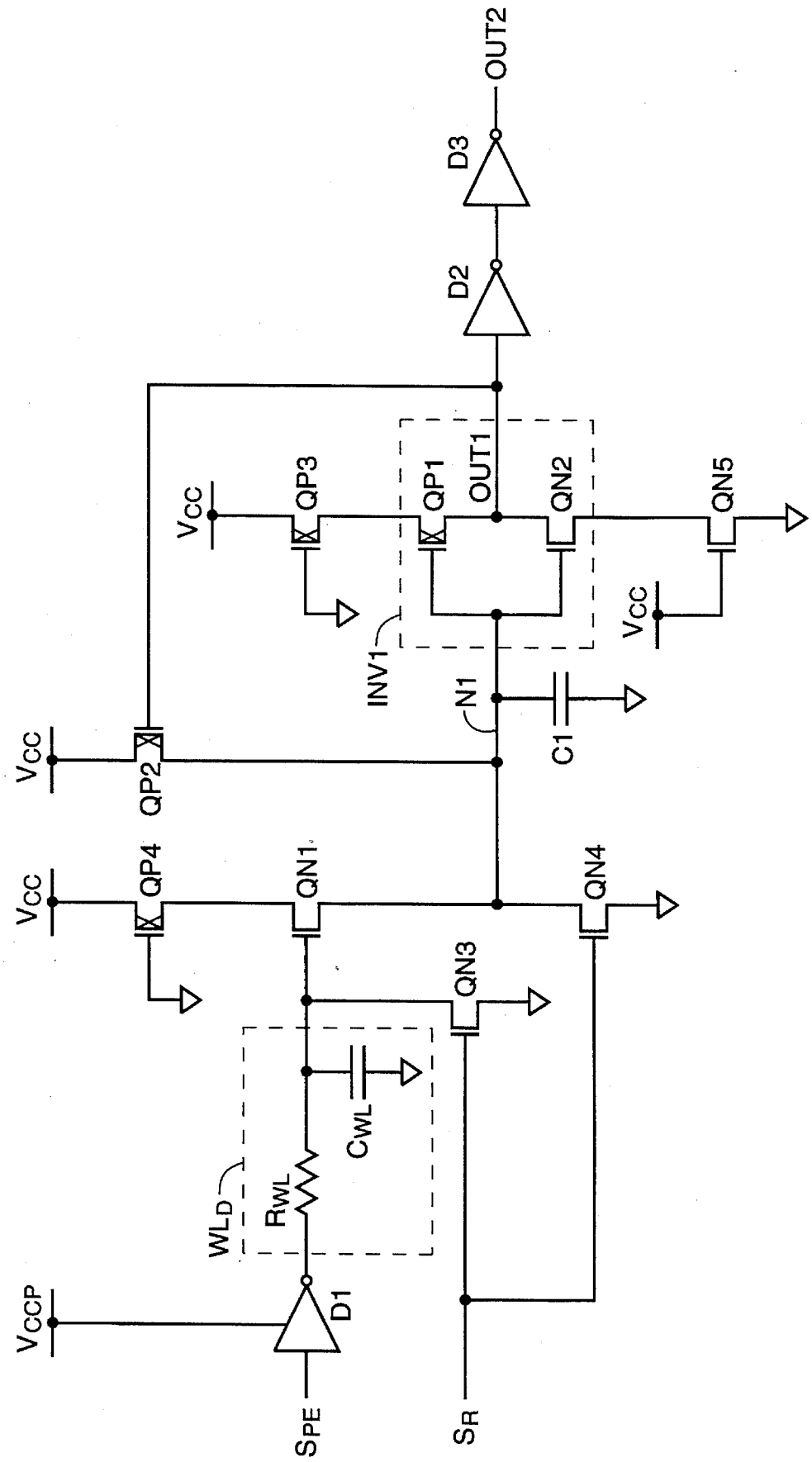
FIG. 1 is a schematic diagram of the sense circuit.

The new low-power sense circuit accurately tracks charge transfer between the capacitor of a dynamic random access memory cell and its associated digit line. The circuit is preferably located in the peripheral circuitry.

Referring now to FIG. 1, the new low-power sense circuit comprises a pull-up node N1 that is coupled to a ground bus held at ground potential through a capacitor C1. The capacitance of C1, which may be varied by multiple options in the final metal mask, is selected so as to accurately simulate digit line capacitance. Node N1 is coupled to a power supply bus carrying a voltage $V_{CC}$ through a first N-channel IGFET QN1, which emulates the operational characteristics of cell access transistors (particularly with regard to threshold voltage) within the dynamic random access memory array. The gate of transistor QN1 is coupled to a dummy wordline driver D1 through a dummy wordline $WL_D$. The dummy wordline $WL_D$, which is structurally identical to a functional wordline in the memory array, has both a resistance $R_{WL}$ and a capacitance $C_{WL}$ associated therewith that provide an RC time constant that closely approximates that of the functional wordlines in the array. The dummy wordline driver D1 has as its input a signal line on which phase enable signal $S_{PE}$, a derivative of RAS (Row Address Strobe), is present. It should be noted that like functional wordline drivers in the array, the pull-up side of dummy wordline driver D1 is coupled to a bootstrapped power supply bus carrying a voltage $V_{CCP}$, a voltage that is bootstrapped above the power supply voltage $V_{CC}$. The bootstrapped voltage applied to the access transistor gates provides enhanced charge transfer through access devices.

Pull-up node N1 is coupled to the inputs of CMOS inverter INV1, which comprises a first P-channel IGFET QP1 and a second N-channel IGFET QN2. The intermediate output signal OUT1 from inverter INV1 is fed back to the gate of a second P-channel IGFET QP2. The function of transistor QP2 is to rapidly pull node N1 to $V_{CC}$ as soon as node N1 surpasses the threshold voltage of transistor QN2 and transistor QN2 has just begun to turn on, pulling the output signal OUT1 toward ground potential.

The gate of transistor QN1 and node N1 are coupled to the ground bus through a third N-channel IGFET QN3 and a fourth N-channel IGFET QN4, respectively. The gates of both transistor QN3 and transistor QN4 are controlled by a reset signal $S_R$ which is utilized to reset the circuit quickly for the next read cycle in cases where the wordline time constant is long and there is insufficient time for unassisted charge bleed-down. An active high reset signal $S_R$ will discharge both pull-up node N1 and the gate of transistor QN1 to ground potential at the beginning of each read cycle if there is insufficient time for unassisted charge bleed-down.

Still referring to FIG. 1, a third P-channel IGFET QP3 and a fifth N-channel IGFET QN5 function primarily as resistors and are employed to limit transient currents inherent to inverter INV1 during periods of transitions from high to low voltage and from low to high voltage on node N1. It should be noted that a fourth P-channel IGFET QP4, which is optional, functions primarily as a resistor. Transistor QP4 is used to reduce the likelihood of damage to the sense circuit from electrostatic discharge events. It will also be noted that the output signal OUT1 of INV1 is passed to a pair of inverting drivers D2 and D3 which strengthen output signal OUT1 and isolate the sense circuit from subsequent circuitry. The final output OUT2 is used to trigger the data latching operation by N-channel and P-channel sense amplifiers during read operations.

Although but a single embodiment of the new sense circuit for tracking charge transfer through access transistors in a DRAM is disclosed and described herein, it will be obvious to those having ordinary skill in the art of integrated circuits, and particularly in the art of DRAM circuitry, that changes and modifications may be made thereto without departing from the scope and the spirit of the invention as hereinafter claimed.

What is claimed is:

1. A sense circuit for tracking charge transfer through cell access transistors in a dynamic random access memory comprising:

a pull-up node;

a capacitor which couples said pull-up node to a ground bus, said capacitor simulating digit line capacitance;

a first N-channel insulated-gate field-effect transistor (IGFET) which emulates cell access transistors and couples said pull-up node to a power supply bus, said first N-channel IGFET having a gate coupled to a dummy wordline driver through a dummy wordline; and a CMOS inverter, said inverter having a first P-channel IGFET which functions as a pull-up transistor, a second N-channel IGFET which functions as a pull-down transistor, an intermediate output coupled to both the power supply bus through the first P-channel IGFET and to the ground bus through the second N-channel IGFET, and a pair of inputs corresponding to the gates of said first P-channel IGFET and said second N-channel IGFET, both inputs being coupled to said pull-up node.

2. The sense circuit of claim 1, which further comprises a second P-channel IGFET which couples the pull-up node to the power supply bus, said second P-channel IGFET having a gate coupled to the intermediate output.

3. The sense circuit of claim 2, which further comprises:

a third N-channel IGFET which couples the gate of the first N-channel IGFET to the ground bus; and a fourth N-channel IGFET which couples the pull-up node to the ground bus;

said third and fourth N-channel IGFETs each having a gate controlled by a reset signal.

4. The sense circuit of claim 3, which further comprises a third P-channel IGFET having a gate coupled to the ground bus, and a fifth N-channel IGFET having a gate coupled to the power supply bus, said third P-channel IGFET being series coupled with said first P-channel IGFET between the power supply bus and the intermediate output, and said fifth N-channel IGFET being series coupled with said second N-channel IGFET between the ground bus and the intermediate output, said third P-channel IGFET and said fifth N-channel IGFET functioning as resistors to limit transient currents during switching of the intermediate output from high to low voltage and from low to high voltage.

5. The sense circuit of claim 4, which further comprises a pair of series coupled inverters through which the intermediate output is passed in order to achieve a final output, said final output being utilized to trigger data latching operation by N-channel and P-channel sense amplifiers in a dynamic random access memory during read operations.

6. The sense circuit of claim 1, wherein the first N-channel IGFET emulates cell access transistors particularly with regard to threshold voltage.

7. A sense circuit for tracking charge transfer through cell access transistors in a dynamic random access memory array comprising:

(a) a dummy wordline to which a signal is applied;

(b) an insulated-gate field-effect transistor (IGFET) which simulates access transistors in the array with respect to threshold voltage, said IGFET having a gate controlled by the signal on the dummy wordline;

(c) a pull-up node that is charged from a power supply bus through the IGFET;

(d) an output signal representative of the charge status on the pull-up node, said output signal being employed to trigger data latching in the memory.

8. The sense circuit of claim 7, wherein said pull-up node is coupled to ground through a capacitor which simulates digit line capacitance.

9. The sense circuit of claim 8, wherein said dummy wordline has associated therewith both a resistance value and a capacitance value, said resistance value and said capacitance value providing an RC time constant for the dummy wordline which closely approximates that of the functional wordlines.

10. The sense circuit of claim 7, wherein said dummy wordline is structurally identical to functional wordlines in the array.

11. The sense circuit of claim 7, wherein said pull-up node is coupled to the output signal via an inverting CMOS driver circuit, said driver circuit having its input directly coupled to the pull-up node.

12. The sense circuit of claim 11, wherein said driver circuit has an intermediate output that is coupled to the gate of a P-channel pull-up transistor, the channel of which couples the pull-up node directly to the power supply bus.

13. The sense circuit of claim 7, wherein said pull-up node is coupled to the output signal via at least one inverting CMOS driver circuit.

* * * * *